(12) United States Patent
Wang et al.

(10) Patent No.: US 10,553,617 B2
(45) Date of Patent: Feb. 4, 2020

(54) PIXEL ARRAY HAVING A PLURALITY OF PIXEL UNIT

(71) Applicant: Au Optronics Corporation, Hsinchu (TW)

(72) Inventors: Jia-Hong Wang, Kaohsiung (TW); Ya-Ling Hsu, New Taipei (TW); Chen-Hsien Liao, Taipei (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 15/912,579

(22) Filed: Mar. 6, 2018

(65) Prior Publication Data

US 2018/0331123 A1 Nov. 15, 2018

(30) Foreign Application Priority Data

May 9, 2017 (TW) .............................. 106115227 A

(51) Int. Cl.
*H01L 27/12* (2006.01)
*H01L 27/32* (2006.01)

(52) U.S. Cl.
CPC ............ *H01L 27/124* (2013.01); *H01L 27/32* (2013.01); *G02F 2201/121* (2013.01); *G02F 2201/123* (2013.01); *G09G 2300/0426* (2013.01); *H01L 27/3262* (2013.01); *H01L 27/3276* (2013.01)

(58) Field of Classification Search
CPC ..................................................... H01L 27/124
USPC ............................................................ 345/82
See application file for complete search history.

(56) References Cited

U.S. PATENT DOCUMENTS

| 9,678,395 | B1* | 6/2017 | Lin | G02F 1/134309 |
| 2016/0299399 | A1* | 10/2016 | Kitani | G02F 1/136286 |
| 2017/0299908 | A1* | 10/2017 | Peng | G06F 3/044 |
| 2018/0188615 | A1* | 7/2018 | Li | G02F 1/1345 |

FOREIGN PATENT DOCUMENTS

| CN | 104536227 | 4/2015 |
| CN | 105549287 | 5/2016 |
| CN | 107290910 | 10/2017 |

* cited by examiner

*Primary Examiner* — Long D Pham
(74) *Attorney, Agent, or Firm* — JCIPRNET

(57) ABSTRACT

A pixel array including a first scan line, a first data line, a first signal line, a first pixel unit, and a second pixel unit is provided. The first pixel unit includes a first common electrode and a second common electrode. The first common electrode and the second common electrode are respectively located on a first side and a second side of the first scan line. The second common electrode is electrically connected to the first signal line through a first conductive structure. The second pixel unit includes a third common electrode and a fourth common electrode. The third common electrode and the fourth common electrode are respectively located on the first side and the second side of the first scan line. The third common electrode is electrically connected to the first signal line through a second conductive structure.

18 Claims, 6 Drawing Sheets

PIXEL ARRAY HAVING A PLURALITY OF PIXEL UNIT

CROSS-REFERENCE TO RELATED APPLICATION

This application claims the priority benefit of Taiwan application serial no. 106115227, filed on May 9, 2017. The entirety of the above-mentioned patent application is hereby incorporated by reference herein and made a part of this specification.

BACKGROUND OF THE INVENTION

1. Field of the Invention

The invention relates to a pixel array, and more particularly, to a pixel array having a conductive structure.

2. Description of Related Art

In recent years, with the continuous progress of display technology, viewer's demand on a display quality (e.g., image resolution, color saturation, etc.) of a display also becomes increasingly higher. Yet, in order to manufacture a display with high performance, a pixel array in the display needs to include conductive structures connecting different conductive layers.

In the pixel array, a great portion of area is occupied by the conductive structures connecting the different conductive layers. Consequently, an aperture ratio of the pixel array is restricted thereby affecting the display quality. Accordingly, there is an urgent need for a method to solve the above problem while increasing the aperture ratio.

SUMMARY OF THE INVENTION

The invention is directed to a pixel array, which is capable of solving the problem of the aperture ratio restricted by the conductive structures.

A pixel array of the invention includes a first scan line, a first data line, a first signal line, a first pixel unit, and a second pixel unit. The first data line is disposed intersecting the first scan line. The first signal line is located on the first data line. The first data line is located between the first pixel unit and the second pixel unit. The first pixel unit includes a first common electrode, a second common electrode, a first pixel electrode and a second pixel electrode. The first common electrode and the second common electrode are respectively located on a first side and a second side of the first scan line. The second common electrode is electrically connected to the first signal line through a first conductive structure. The first pixel electrode and the second pixel electrode are respectively overlapping a part of the first common electrode and a part of the second common electrode. The second pixel unit includes a third common electrode, a fourth common electrode, a third pixel electrode and a fourth pixel electrode. The third common electrode and the fourth common electrode are respectively located on the first side and the second side of the first scan line. The first common electrode is electrically connected to the third common electrode, the second common electrode is electrically connected to the fourth common electrode, and the third common electrode is electrically connected to the first signal line through a second conductive structure. The third pixel electrode and the fourth pixel electrode are respectively overlapping a part of the third common electrode and a part of the fourth common electrode.

Based on the above, in the pixel array of the invention, the first pixel unit has the first conductive structure, and the second pixel unit has the second conductive structure. Because the second common electrode of the first pixel unit can be electrically connected to the third common electrode of the second pixel unit simply through two conductive structures and the first signal line, the number of conductive structures required for conducting through the common electrodes may be reduced accordingly. In this way, the problem regarding the insufficient aperture ratio of the pixel array can be solved.

To make the above features and advantages of the disclosure more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
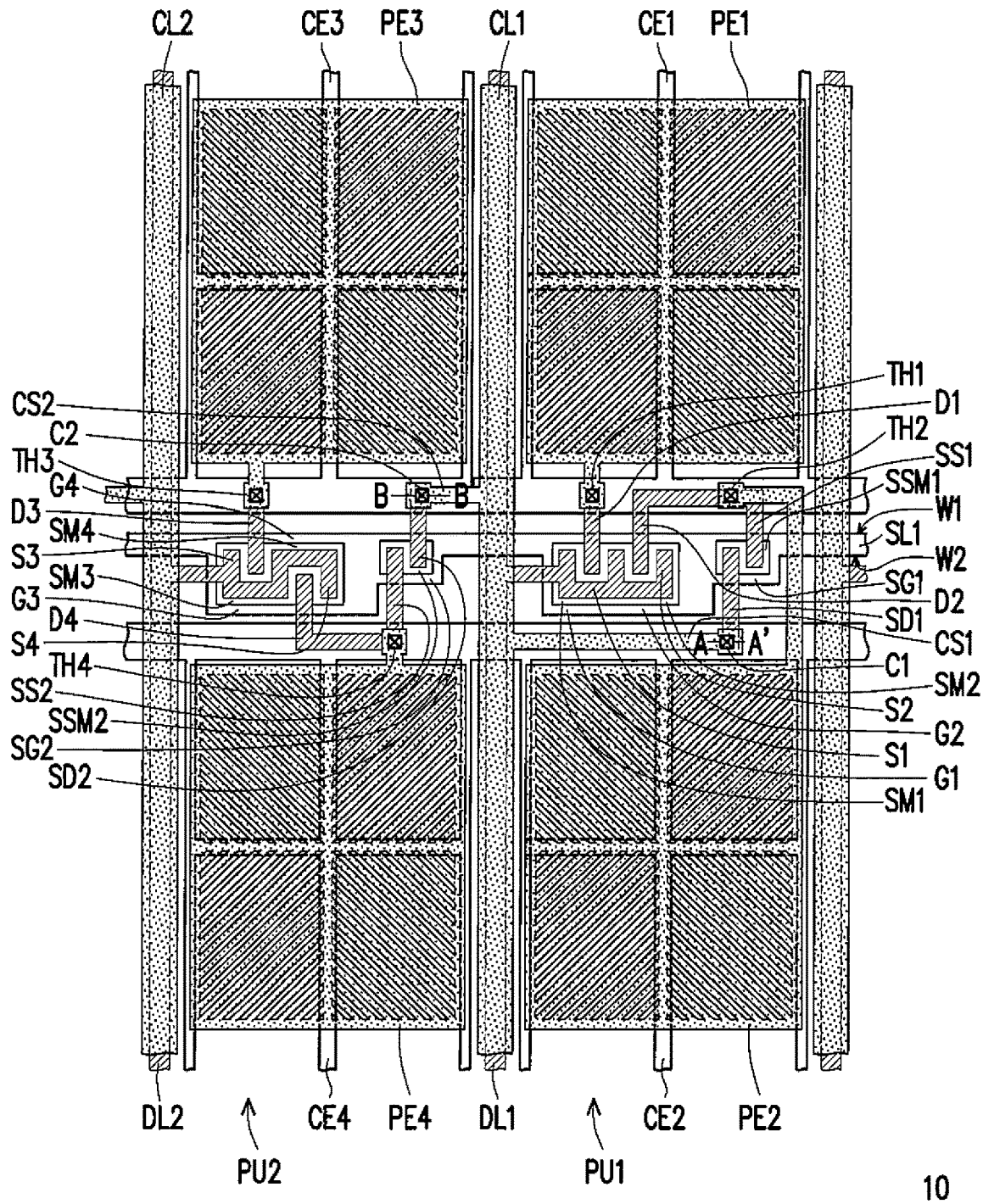
FIG. 1A is a top view of a pixel array according to an embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

The following describes the embodiments with reference to the accompanying drawings in detail, so as to make the aspects of the present disclosure more comprehensible. However, the mentioned embodiments are not intended to limit the scope of the present disclosure, and the description of the operation of a structure is not intended to limit an execution sequence. Any device with equivalent functions that is produced from a structure formed by a recombination of elements shall fall within the scope of the present disclosure. Besides, according to industry standards and practices, the drawings are merely intended to assist the description, and are not drawn according to original dimensions. In practice, dimensions of various features may be arbitrarily increased or decreased to facilitate the description. Same elements in the description below are indicated by a same reference sign, so as to facilitate the comprehension.

In the present disclosure, when an element is "connected" or "coupled", it may indicate that the element is "electrically connected" or "electrically coupled". "Connected" or "coupled" may further be used to indicate that two or more elements operate cooperatively or interact with each other. Oppositely, when an element is "directly on another element" or "directly connected to" another element, there is no intermediate element. As used herein, "connection" may refer to physical and/or electrical connection.

As used herein, "about", "similar", or "substantially" includes the value and an average value of values in an acceptable deviation range of a specific value determined by a person of ordinary skill in the art, taking the discussed measurement and a specific quantity of errors related to the measurement (that is, limitations of a measurement system) into consideration. For example, "substantially" may indicate within one or more standard deviations of the value, or within ±10%, or ±5%.

Unless otherwise defined, as used herein, all the terms (including technical and scientific terms) have the same meanings as commonly understood by a person of ordinary skill in the art. It will be further understood that terms defined in commonly used dictionaries shall be comprehended as meanings the same as the meanings in the related art and the context of the present disclosure, and shall not be comprehended as ideal or excessively formal meanings, unless this specification clearly defined otherwise.

Figure 1B:
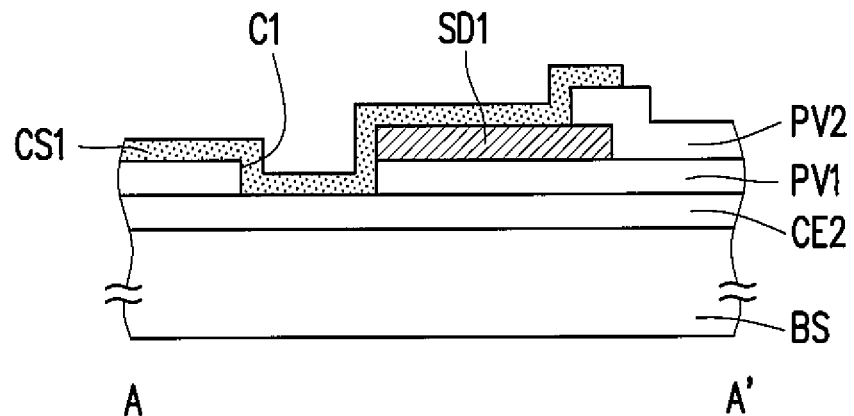
FIG. 1B is a cross-sectional view taken along line AA' of FIG. 1A.
Figure 1C:
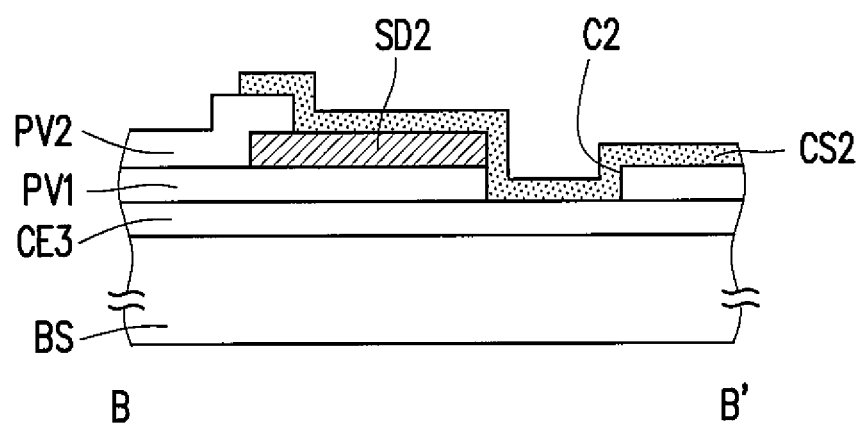
FIG. 1C is a cross-sectional view taken along line BB' of FIG. 1A.

FIG. 1A is a top view of a pixel array 10 according to an embodiment of the invention. FIG. 1B is a cross-sectional view taken along line AA' of FIG. 1A. FIG. 1C is a cross-sectional view taken along line BB' of FIG. 1A.

Referring to FIG. 1A, FIG. 1B and FIG. 1C together, the pixel array 10 includes a first scan line SL1, a first data line DL1, a second data line DL2, a first signal line CL1, a first pixel unit PU1 and a second pixel unit PU2. The first data line DL1 is disposed intersecting the first scan line SL1. In an embodiment, the second data line DL2 is also disposed intersecting the first scan line SL1. The first signal line CL1 is located on the first data line DL1. In another embodiment, the pixel array 10 further includes a second signal line CL2 located on the second data line DL2. The first data line DL1 is located between the first pixel unit PU1 and the second pixel unit PU2. In other words, in this example, the first pixel unit PU1 and the second pixel unit PU2 are respectively located on the left and right sides of the first data line DL1. In an embodiment, the second pixel unit PU2 is located between the second data line DL2 and the first data line DL1. In an embodiment, the first pixel unit PU1 and the second pixel unit PU2 are formed on a substrate BS.

The first pixel unit PU1 includes a first common electrode CE1, a second common electrode CE2, a first pixel electrode PE1 and a second pixel electrode PE2. The first common electrode CE1 and the second common electrode CE2 are respectively located on a first side W1 and a second side W2 of the first scan line SL1. The second common electrode CE2 is electrically connected to the first signal line CL1 through a first conductive structure CS1. The first pixel electrode PE1 and the second pixel electrode PE2 are respectively overlapping a part of the first common electrode CE1 and a part of the second common electrode CE2.

In an embodiment, the first pixel unit PU1 further includes a first switch element TFT1 and a second switch element TFT2.

The first switch element TFT1 includes a first drain electrode D1, a first source electrode S1, a first gate electrode G1 and a first semiconductor layer SM1. The first gate electrode G1 of the first switch element TFT1 is electrically connected to the first scan line SL1, the first source electrode S1 is electrically connected to the first data line DL1, and the first pixel electrode PE1 is electrically connected to the first drain electrode D1 through a first contact TH1. At least part of the first semiconductor layer SM1 is located between the first gate electrode G1, the first source electrode S1 and the first drain electrode D1.

The second switch element TFT2 includes a second drain electrode D2, a second source electrode S2, a second gate electrode G2 and a second semiconductor layer SM2. The second gate electrode G2 of the second switch element TFT2 is electrically connected to the first scan line SL1. In an embodiment, the second source electrode S2 of the second switch element TFT2 may be electrically connected to the first source electrode S1; more specifically, the second source electrode S2 of the second switch element TFT2 is electrically connected to the first data line DL1 through the first switch element TFT1. The second pixel electrode PE2 is electrically connected to the second drain electrode D2 through a second contact TH2. At least part of the second semiconductor layer SM2 is located between the second gate electrode G2, the second source electrode S2 and the second drain electrode D2.

In the present embodiment, the first drain electrode D1 and the second drain electrode D2 both extend towards the first pixel electrode PE1. In an embodiment, the first source electrode S1 and the second source electrode S2 include U-shaped openings, and the U-shaped openings of the first source electrode S1 and the second source electrode S2 both face towards the first pixel electrode PE1.

In an embodiment, the first pixel unit PU1 further includes a first sharing element ST1. The first sharing element ST1 includes a gate electrode SG1, a semiconductor layer SSM1, a source electrode SS1 and a drain electrode SD1. The gate electrode SG1 of the first sharing element ST1 is electrically connected to the first scan line SL1. At least part of the semiconductor layer SSM1 is located between the gate electrode SG1, the source electrode SS1 and the drain electrode SD1. The source electrode SS1 is electrically connected to the second pixel electrode PE2 through the second contact TH2, and the source electrode SS1 is electrically connected to the second drain electrode D2 of the second switch element TFT2. The first conductive structure CS1 electrically connects the first signal line CL1, the drain electrode SD1 of the first sharing element ST1 and the second common electrode CE2.

In an embodiment, the first signal line CL1, the drain electrode SD1 of the first sharing element ST1 and the second common electrode CE2 belong to different film layers. The film layer where the drain electrode SD1 of the first sharing element ST1 is located is sandwiched between the film layer where the first signal line CL1 is located and the film layer where the second common electrode CE2 is located. In the present embodiment, the first conductive structure CS1 electrically connects the first signal line CL1, the drain electrode SD1 of the first sharing element ST1 and the second common electrode CE2. In an embodiment, an insulation layer PV2 is sandwiched between the film layer where the first signal line CL1 is located and the film layer where the drain electrode SD1 of the first sharing element ST1 is located, and an insulation layer PV1 is sandwiched between the film layer where the drain electrode SD1 of the first sharing element ST1 is located and the film layer where the second common electrode CE2 is located. In an embodiment, an opening C1 penetrates the insulation layer PV1 and the insulation layer PV2, and the first conductive structure CS1 is filled in the opening C1.

The second pixel unit PU2 includes a third common electrode CE3, a fourth common electrode CE4, a third pixel electrode PE3 and a fourth pixel electrode PE4. The third common electrode CE3 and the fourth common electrode CE4 are respectively located on the first side W1 and the second side W2 of the first scan line SL1. The third pixel electrode PE3 and the fourth pixel electrode PE4 are respectively overlapping a part of the third common electrode CE3 and a part of the fourth common electrode CE4.

In an embodiment, the second pixel unit PU2 further includes a third switch element TFT3 and a fourth switch element TFT4.

The third switch element TFT3 includes a third drain electrode D3, a third source electrode S3, a third gate electrode G3 and a third semiconductor layer SM3. The third gate electrode G3 of the third switch element TFT3 is electrically connected to the first scan line SL1, the third source electrode S3 is electrically connected to the second data line DL2, and the third pixel electrode PE3 is electrically connected to the third drain electrode D3 through a third contact TH3. At least part of the third semiconductor layer SM3 is located between the third gate electrode G3, the third source electrode S3 and the third drain electrode D3.

The fourth switch element TFT4 includes a fourth drain electrode D4, a fourth source electrode S4, a fourth gate electrode G4 and a fourth semiconductor layer SM4. The fourth gate electrode G4 of the fourth switch element TFT4 is electrically connected to the first scan line SL1. In an embodiment, the fourth source electrode S4 of the fourth switch element TFT4 may be electrically connected to the third source electrode S3; more specifically, the fourth source electrode S4 of the fourth switch element TFT4 is electrically connected to the second data line DL2 through the third switch element TFT3. The fourth pixel electrode PE4 is electrically connected to the fourth drain electrode D4 through a fourth contact TH4. At least part of the fourth semiconductor layer SM4 is located between the fourth gate electrode G4, the fourth source electrode S4 and the fourth drain electrode D4.

In the present embodiment, the third drain electrode D3 extends towards the third pixel electrode PE3, and the fourth drain electrode D4 extends towards the fourth pixel electrode PE4. In an embodiment, the third source electrode S3 and the fourth source electrode S4 include U-shaped openings, and the U-shaped openings of the third source electrode S3 and the fourth source electrode S4 respectively face the third pixel electrode PE3 and the fourth pixel electrode PE4.

In an embodiment, the second pixel unit PU2 further includes a second sharing element ST2. The second sharing element ST2 includes a gate electrode SG2, a semiconductor layer SSM2, a source electrode SS2 and a drain electrode SD2. The gate electrode SG2 of the second sharing element ST2 is electrically connected to the first scan line SL1. At least part of the semiconductor layer SSM2 is located between the gate electrode SG2, the source electrode SS2 and the drain electrode SD2. The source electrode SS2 is electrically connected to the fourth pixel electrode PE4 through the fourth contact TH4, and the source electrode SS2 is electrically connected to the fourth drain electrode D4 of the fourth switch element TFT4. A second conductive structure CS2 electrically connects the first signal line CL1, the drain electrode SD2 of the second sharing element ST2 and the third common electrode CE3.

In an embodiment, the first signal line CL1, the drain electrode SD2 of the second sharing element ST2 and the third common electrode CE3 belong to different film layers. The film layer where the drain electrode SD2 of the second sharing element ST2 is located is sandwiched between the film layer where the first signal line CL1 is located and the film layer where the third common electrode CE3 is located.

In the present embodiment, the second conductive structure CS2 electrically connects the first signal line CL1, the drain electrode SD2 of the second sharing element ST2 and the third common electrode CE3. In an embodiment, the insulation layer PV2 is sandwiched between the film layer where the first signal line CL1 is located and the film layer where the drain electrode SD2 of the second sharing element ST2 is located, and the insulation layer PV1 is sandwiched between the film layer where the drain electrode SD2 of the second sharing element ST2 is located and the film layer where the third common electrode CE3 is located. In an embodiment, an opening C2 penetrates the insulation layer PV1 and the insulation layer PV2, and the second conductive structure CS2 is filled in the opening C2.

In an embodiment, the first common electrode CE1 is electrically connected to the third common electrode CE3, and the second common electrode CE2 is electrically connected to the fourth common electrode CE4. In an embodiment, the first pixel unit PU1 is adjacent to the second pixel unit PU2, the first common electrode CE1 is structurally connected to the third common electrode CE3, and the second common electrode CE2 is structurally connected to the fourth common electrode CE4.

In an embodiment, the first common electrode CE1, the second common electrode CE2, the third common electrode CE3, the fourth common electrode CE4 and the first scan line SL1 belong to a same film layer. In an embodiment, the first pixel electrode PE1, the second pixel electrode PE2, the third pixel electrode PE3, the fourth pixel electrode PE4, the first signal line CL1, the first conductive structure CS1 and the second conductive structure CS2 belong to a same film layer.

Based on the above, in the pixel array 10 of the present embodiment, the first pixel unit PU1 has the first conductive structure CS1, and the second pixel unit PU2 has the second conductive structure CS2. The second common electrode CE2 of the first pixel unit PU1 can be electrically connected to the third common electrode CE3 of the second pixel unit PU2 simply through the first conductive structure CS1, the second conductive structure CS2 and the first signal line CL1. Because the common electrodes on the different sides of the scan line can be electrically connected by utilizing the conductive structures in the different pixel units and commonly constitute a mesh structure, the number of the conductive structures required for conducting through the common electrodes can be reduced. In an embodiment, the first sharing element ST1 is electrically connected to the second common electrode CE2 and the first signal line CL1 through the first conductive structure CS1, and the second sharing element ST2 is electrically connected to the third common electrode CE3 and the first signal line CL1 through the second conductive structure CS2. In this way, the problem regarding insufficient aperture ratio of the pixel array 10 can be solved.

Figure 2:
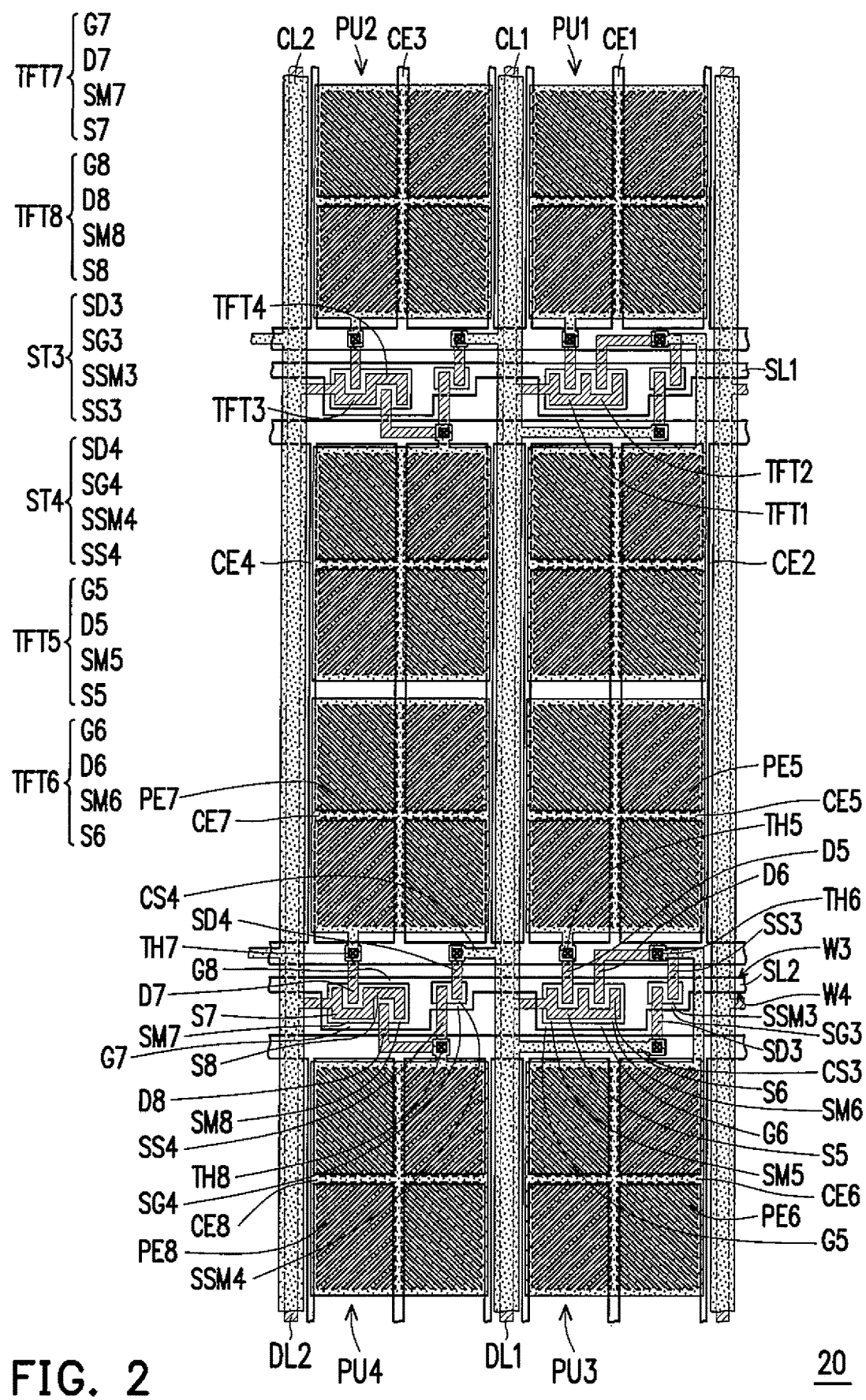
FIG. 2 is a top view of a pixel array according to an embodiment of the invention.

FIG. 2 is a top view of a pixel array 20 according to an embodiment of the invention. It should be noted that, the embodiment of FIG. 2 adopts the reference numbers and part of the content in the embodiment of FIG. 1, where identical or similar reference numbers are used to indicate identical or similar components, and repeated description for the same technical contents is omitted. The omitted part of the description can refer to the foregoing embodiment, which is not repeated in the following embodiments.

The difference between the pixel array 20 of FIG. 2 and the pixel array 10 of FIG. 1 is that, the pixel array 20 further includes a second scan line SL2, a third pixel unit PU3 and a fourth pixel unit PU4.

The second scan line SL2 is disposed intersecting the first data line DL1 and the second data line DL2. In an embodiment, the third pixel unit PU3 is similar to the first pixel unit PU1. The third pixel unit PU3 includes a fifth switch element TFT5, a sixth switch element TFT6, a fifth common electrode CE5, a sixth common electrode CE6, a fifth pixel electrode PE5 and a sixth pixel electrode PE6.

In the present embodiment, the fifth switch element TFT5 and the sixth switch element TFT6 are electrically connected to the second scan line SL2. The fifth common electrode CE5 and the sixth common electrode CE6 are respectively located on a first side W3 and a second side W4 of the second scan line SL2. The fifth pixel electrode PE5 and the sixth pixel electrode PE6 are respectively overlapping a part of the fifth common electrode CE5 and a part of the sixth common electrode CE6.

The fifth switch element TFT5 includes a fifth drain electrode D5, a fifth source electrode S5, a fifth gate electrode G5 and a fifth semiconductor layer SM5. The fifth gate electrode G5 of the fifth switch element TFT5 is electrically connected to the second scan line SL2. The fifth source electrode S5 is electrically connected to the first data line DL1. The fifth pixel electrode PE5 is electrically connected to the fifth drain electrode D5 through a fifth contact TH5. At least part of the fifth semiconductor layer SM5 is located between the fifth gate electrode G5, the fifth source electrode S5 and the fifth drain electrode D5.

The sixth switch element TFT6 includes a sixth drain electrode D6, a sixth source electrode S6, a sixth gate electrode G6 and a sixth semiconductor layer SM6. The sixth gate electrode G6 of the sixth switch element TFT6 is electrically connected to the second scan line SL2. In an embodiment, the sixth source electrode S6 of the sixth switch element TFT6 may be electrically connected to the fifth source electrode S5; more specifically, the sixth source electrode S6 of the sixth switch element TFT6 is electrically connected to the first data line DL1 through the fifth switch element TFT5. The sixth pixel electrode PE6 is electrically connected to the sixth drain electrode D6 through a sixth contact TH6. At least part of the sixth semiconductor layer SM6 is located between the sixth gate electrode G6, the sixth source electrode S6 and the sixth drain electrode D6.

In an embodiment, the fifth drain electrode D5 and the sixth drain electrode D6 both extend towards the fifth pixel electrode PE5. In an embodiment, the fifth source electrode S5 and the sixth source electrode S6 include U-shaped openings, and the U-shaped openings of the fifth source electrode S5 and the sixth source electrode S6 both face towards the fifth pixel electrode PE5.

In an embodiment, the third pixel unit PU3 further includes a third sharing element ST3. The third sharing element ST3 includes a gate electrode SG3, a semiconductor layer SSM3, a source electrode SS3 and a drain electrode SD3. The gate electrode SG3 of the third sharing element ST3 is electrically connected to the second scan line SL2. At least part of the semiconductor layer SSM3 is located between the gate electrode SG3, the source electrode SS3 and the drain electrode SD3. The source electrode SS3 of the third sharing element ST3 is electrically connected to the sixth pixel electrode PE6 through the sixth contact TH6, and the drain electrode SD3 of the third sharing element ST3 is electrically connected to the sixth common electrode CE6 through a third conductive structure CS3. The third conductive structure CS3 electrically connects the first signal line CL1, the drain electrode SD3 of the third sharing element ST3 and the sixth common electrode CE6.

In an embodiment, the fourth pixel unit PU4 is similar to the second pixel unit PU2. The fourth pixel unit PU4 includes a seventh switch element TFT7, an eighth switch element TFT8, a seventh common electrode CE7, an eighth common electrode CE8, a seventh pixel electrode PE7, an eighth pixel electrode PE8, a fourth sharing element ST4 and a fourth conductive structure CS4.

The seventh switch element TFT7 and the eighth switch element TFT8 are electrically connected to the second scan line SL2. The seventh common electrode CE7 and the eighth common electrode CE8 are respectively located on the first side W3 and the second side W4 of the second scan line SL2. The fifth common electrode CE5 is electrically connected to the seventh common electrode CE7, and the sixth common electrode CE6 is electrically connected to the eighth common electrode CE8. The seventh pixel electrode PE7 and the eighth pixel electrode PE8 are respectively overlapping a part of the seventh common electrode CE7 and a part of the eighth common electrode CE8.

The seventh switch element TFT7 includes a seventh drain electrode D7, a seventh source electrode S7, a seventh gate electrode G7 and a seventh semiconductor layer SM7. The seventh gate electrode G7 of the seventh switch element TFT7 is electrically connected to the second scan line SL2. The seventh source electrode S7 is electrically connected to the second data line DL2. The seventh pixel electrode PE7 is electrically connected to the seventh drain electrode D7 through a seventh contact TH7. At least part of the seventh semiconductor layer SM7 is located between the seventh gate electrode G7, the seventh source electrode S7 and the seventh drain electrode D7.

The eighth switch element TFT8 includes an eighth drain electrode D8, an eighth source electrode S8, an eighth gate electrode G8 and an eighth semiconductor layer SM8. The eighth gate electrode G8 of the eighth switch element TFT8 is electrically connected to the second scan line SL2. In an embodiment, the eighth source electrode S8 of the eighth switch element TFT8 may be electrically connected to the seventh source electrode S7; more specifically, the eighth source electrode S8 of the eighth switch element TFT8 is electrically connected to the second data line DL2 through the seventh switch element TFT7. The eighth pixel electrode PE8 is electrically connected to the eighth drain electrode D8 through an eighth contact TH8. At least part of the eighth semiconductor layer SM8 is located between the eighth gate electrode G8, the eighth source electrode S8 and the eighth drain electrode D8.

In an embodiment, the fourth pixel unit PU4 further includes the fourth sharing element ST4. The fourth sharing element ST4 includes a gate electrode SG4, a semiconductor layer SSM4, a source electrode SS4 and a drain electrode SD4. The gate electrode SG4 of the fourth sharing element ST4 is electrically connected to the second scan line SL2. At least part of the semiconductor layer SSM4 is located between the gate electrode SG4, the source electrode SS4 and the drain electrode SD4. The source electrode SS4 of the fourth sharing element ST4 is electrically connected to the eighth pixel electrode PE8 through the eighth contact TH8, and the drain electrode SD4 of the fourth sharing element ST4 is electrically connected to the first signal line CL1 through the fourth conductive structure CS4. The fourth conductive structure CS4 electrically connects the first signal line CL1, the drain electrode SD4 of the fourth sharing element ST4 and the seventh common electrode CE7.

In an embodiment, the fifth common electrode CE5 is electrically connected to the seventh common electrode CE7, and the sixth common electrode CE6 is electrically connected to the eighth common electrode CE8. In an embodiment, the third pixel unit PU3 is adjacent to the fourth pixel unit PU4, the fifth common electrode CE5 is structurally connected to the seventh common electrode CE7, and the sixth common electrode CE6 is structurally connected to the eighth common electrode CE8.

In an embodiment, the fifth common electrode CE5 is electrically connected to the second common electrode CE2. In an embodiment, the first pixel unit PU1 and the third pixel unit PU3 are located on adjacent rows, and the fifth common electrode CE5 of the third pixel unit PU3 is structurally connected to the second common electrode CE2 of the first pixel unit PU1. In an embodiment, the seventh common electrode CE7 is electrically connected to the fourth common electrode CE4. In an embodiment, the second pixel unit PU2 and the fourth pixel unit PU4 are located on adjacent rows, and the seventh common electrode CE7 of the fourth pixel unit PU4 is structurally connected to the fourth common electrode CE4 of the second pixel unit PU2.

Based on the above, in the pixel array 20 of the present embodiment, the third pixel unit PU3 has the third conductive structure CS3, and the fourth pixel unit PU4 has the fourth conductive structure CS4. The sixth common electrode CE6 of the third pixel unit PU3 can be electrically connected to the seventh common electrode CE7 of the fourth pixel unit PU4 simply through the third conductive structure CS3, the fourth conductive structure CS4 and the first signal line CL1. Because the common electrodes on the different sides of the scan line can be electrically connected by utilizing the conductive structures in the different pixel units and commonly constitute a mesh structure, the number of the conductive structures required for conducting through the common electrodes can be reduced. In an embodiment, the third sharing element ST3 is electrically connected to the sixth common electrode CE6 and the first signal line CL1 through the third conductive structure CS3, and the fourth sharing element ST4 is electrically connected to the seventh common electrode CE7 and the first signal line CL1 through the fourth conductive structure CS4. In this way, the problem regarding insufficient aperture ratio of the pixel array 20 can be solved.

Figure 3:
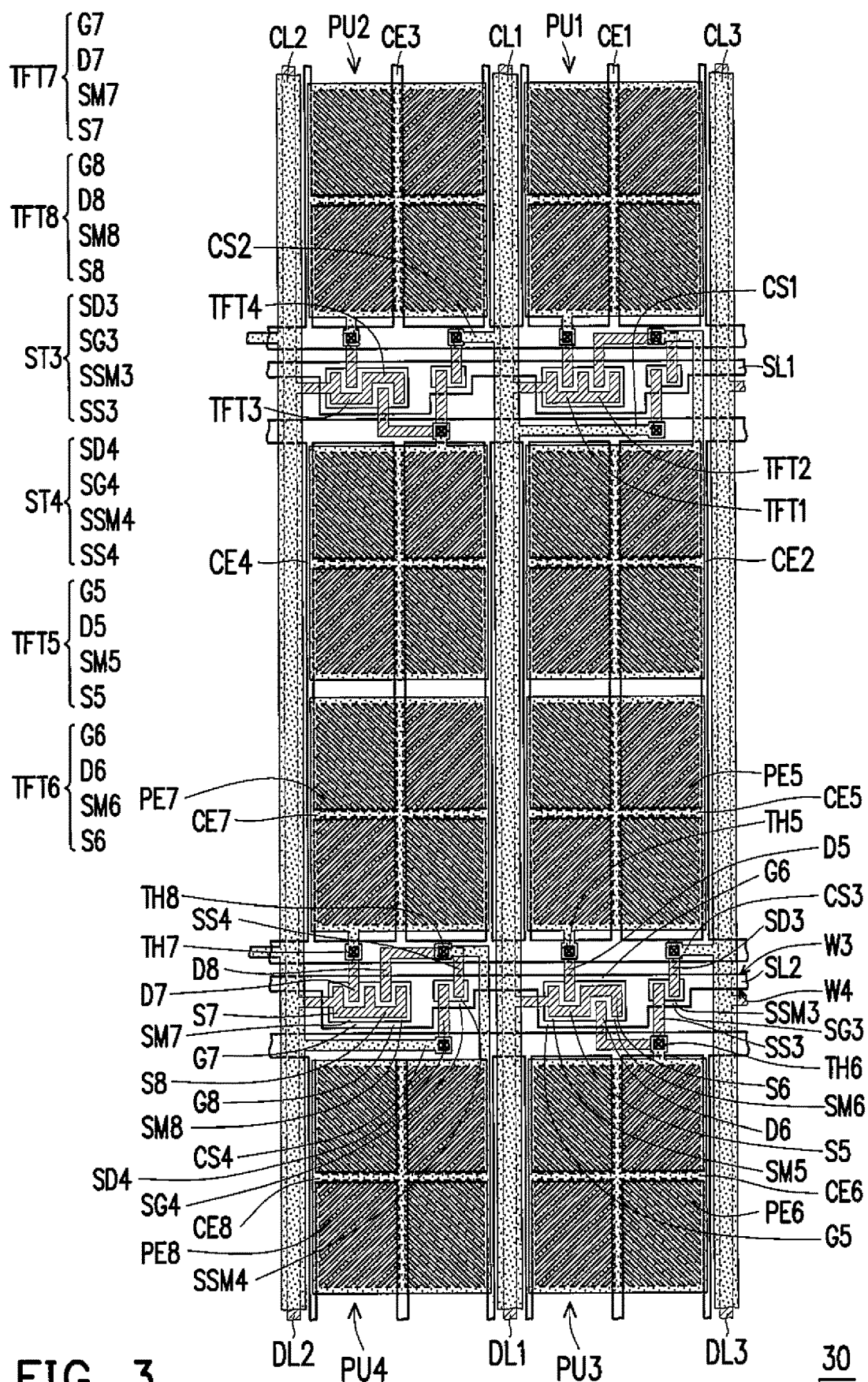
FIG. 3 is a top view of a pixel array according to an embodiment of the invention.

FIG. 3 is a top view of a pixel array 30 according to an embodiment of the invention. It should be noted that, the embodiment of FIG. 3 adopts the reference numbers and part of the content in the embodiment of FIG. 1, where identical or similar reference numbers are used to indicate identical or similar components, and repeated description for the same technical contents is omitted. The omitted part of the description can refer to the foregoing embodiment, which is not repeated in the following embodiments.

The difference between the pixel array 30 of FIG. 3 and the pixel array 10 of FIG. 1 is that, the pixel array 30 further includes a second scan line SL2, a third data line DL3, a second signal line CL2, a third signal line CL3, a third pixel unit PU3 and a fourth pixel unit PU4.

The second scan line SL2 is disposed intersecting the first data line DL1 and the second data line DL2. The third data line DL3 is disposed intersecting the first scan line SL1. The first data line DL1 is located between the second data line DL2 and the third data line DL3. The second signal line CL2 is located on the second data line DL2. The third signal line CL3 is located on the third data line DL3.

The third pixel unit PU3 is located between the first data line DL1 and the third data line DL3. The third pixel unit PU3 includes a fifth switch element TFT5, a sixth switch element TFT6, a fifth common electrode CE5, a sixth common electrode CE6, a fifth pixel electrode PE5 and a sixth pixel electrode PE6.

The fifth common electrode CE5 and the sixth common electrode CE6 are respectively located on a first side W3 and a second side W4 of the second scan line SL2. The fifth pixel electrode PE5 and the sixth pixel electrode PE6 are respectively overlapping a part of the fifth common electrode CE5 and a part of the sixth common electrode CE6. The fifth common electrode CE5 is electrically connected to the third signal line CL3 through a third conductive structure CS3.

The fifth switch element TFT5 includes a fifth drain electrode D5, a fifth source electrode S5, a fifth gate electrode G5 and a fifth semiconductor layer SM5. The fifth gate electrode G5 of the fifth switch element TFT5 is electrically connected to the second scan line SL2, the fifth source electrode S5 is electrically connected to the first data line DL1, and the fifth pixel electrode PE5 is electrically connected to the fifth drain electrode D5 through a fifth contact TH5. At least part of the fifth semiconductor layer SM5 is located between the fifth gate electrode G5, the fifth source electrode S5 and the fifth drain electrode D5.

The sixth switch element TFT6 includes a sixth drain electrode D6, a sixth source electrode S6, a sixth gate electrode G6 and a sixth semiconductor layer SM6. The sixth gate electrode G6 of the sixth switch element TFT6 is electrically connected to the second scan line SL2. In an embodiment, the sixth source electrode S6 of the sixth switch element TFT6 may be electrically connected to the fifth source electrode S5; more specifically, the sixth source electrode S6 of the sixth switch element TFT6 is electrically connected to the first data line DL1 through the fifth switch element TFT5. The sixth pixel electrode PE6 is electrically connected to the sixth drain electrode D6 through a sixth contact TH6. At least part of the sixth semiconductor layer SM6 is located between the sixth gate electrode G6, the sixth source electrode S6 and the sixth drain electrode D6.

In the present embodiment, the fifth drain electrode D5 of the fifth switch element TFT5 extends towards the fifth pixel electrode PE5, and the sixth drain electrode D6 of the sixth switch element TFT6 extends towards the sixth pixel electrode PE6.

In an embodiment, the third pixel unit PU3 further includes a third sharing element ST3. The third sharing element ST3 includes a gate electrode SG3, a semiconductor layer SSM3, a source electrode SS3 and a drain electrode SD3. The gate electrode SG3 of the third sharing element ST3 is electrically connected to the second scan line SL2. At least part of the semiconductor layer SSM3 is located between the gate electrode SG3, the source electrode SS3 and the drain electrode SD3. The source electrode SS3 of the third sharing element ST3 is electrically connected to the sixth pixel electrode PE6 through the sixth contact TH6, and the third conductive structure CS3 electrically connects the third signal line CL3, the drain electrode SD3 of the third sharing element ST3 and the fifth common electrode CE5.

The fourth pixel unit PU4 is located between the first data line DL1 and the second data line DL2. The fourth pixel unit PU4 includes a seventh switch element TFT7, an eighth switch element TFT8, a seventh common electrode CE7, an eighth common electrode CE8, a seventh pixel electrode PE7 and an eighth pixel electrode PE8. The seventh common electrode CE7 and the eighth common electrode CE8 are respectively located on the first side and the second side of the second scan line SL2. The fifth common electrode CE5 is electrically connected to the seventh common electrode CE7, and the sixth common electrode CE6 is electrically connected to the eighth common electrode CE8. The seventh pixel electrode PE7 and the eighth pixel electrode PE8 are respectively overlapping a part of the seventh common electrode CE7 and a part of the eighth common electrode CE8. The eighth common electrode CE8 is electrically connected to the second signal line CL2 through a fourth conductive structure CS4.

The seventh switch element TFT7 includes a seventh drain electrode D7, a seventh source electrode S7, a seventh gate electrode G7 and a seventh semiconductor layer SM7. The seventh gate electrode G7 of the seventh switch element TFT7 is electrically connected to the second scan line SL2, the seventh source electrode S7 is electrically connected to the second data line DL2, and the seventh pixel electrode PE7 is electrically connected to the seventh drain electrode D7 through a seventh contact TH7. At least part of the seventh semiconductor layer SM7 is located between the seventh gate electrode G7, the seventh source electrode S7 and the seventh drain electrode D7.

The eighth switch element TFT8 includes an eighth drain electrode D8, an eighth source electrode S8, an eighth gate electrode G8 and an eighth semiconductor layer SM8. The eighth gate electrode G8 of the eighth switch element TFT8 is electrically connected to the second scan line SL2. In an embodiment, the eighth source electrode S8 of the eighth switch element TFT8 may be electrically connected to the seventh source electrode S7; more specifically, the eighth source electrode S8 of the eighth switch element TFT8 is electrically connected to the second data line DL2 through the seventh switch element TFT7. The eighth pixel electrode PE8 is electrically connected to the eighth drain electrode D8 through an eighth contact TH8. At least part of the eighth semiconductor layer SM8 is located between the eighth gate electrode G8, the eighth source electrode S8 and the eighth drain electrode D8.

In the present embodiment, the seventh drain electrode D7 of the seventh switch element TFT7 and the eighth drain electrode D8 of the eighth switch element TFT8 both extend towards the seventh pixel electrode PE7.

In an embodiment, the fourth pixel unit PU4 further includes the fourth sharing element ST4. The fourth sharing element ST4 includes a gate electrode SG4, a semiconductor layer SSM4, a source electrode SS4 and a drain electrode SD4. The gate electrode SG4 of the fourth sharing element ST4 is electrically connected to the second scan line SL2. At least part of the semiconductor layer SSM4 is located between the gate electrode SG4, the source electrode SS4 and the drain electrode SD4. The source electrode SS4 of the fourth sharing element ST4 is electrically connected to the eighth pixel electrode PE8 through the eighth contact TH8, and the fourth conductive structure CS4 is electrically connected to the second signal line CL2, the drain electrode SD4 of the fourth sharing element ST4 and the eighth common electrode CE8.

In the present embodiment, the first conductive structure CS1 is similar to the fourth conductive structure CS4, and the second conductive structure CS2 is similar to the third conductive structure CS3. With the first conductive structure CS1/the fourth conductive structure CS4 and the second conductive structure CS2/the third conductive structure CS3 being alternately arranged in a column direction (an extending direction of the data lines) and a row direction (an extending direction of the scan lines) to prevent similar conductive structures from gathering together, an impedance difference caused by the conductive structures can be evenly distributed.

Figure 4:
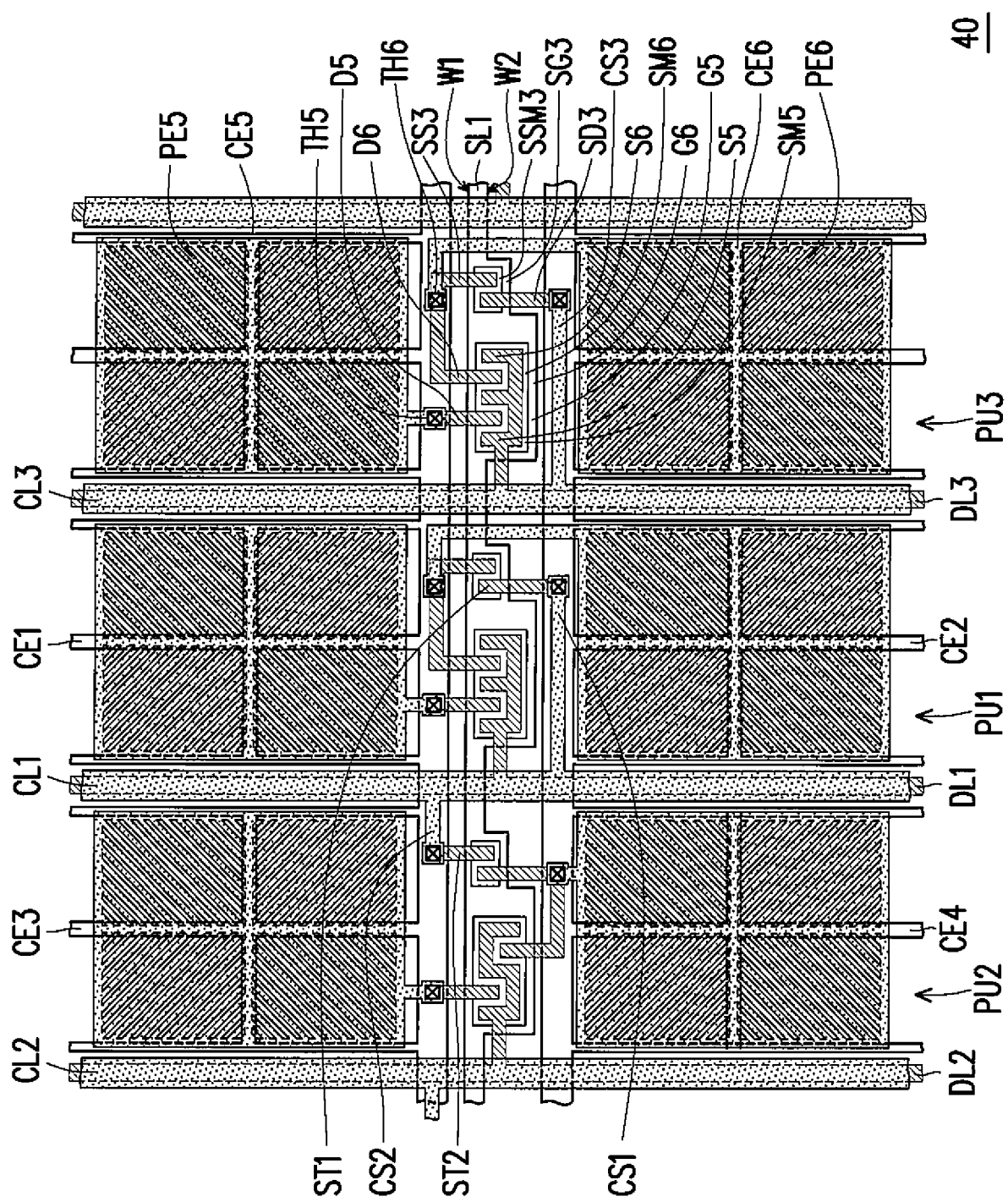
FIG. 4 is a top view of a pixel array according to an embodiment of the invention.

FIG. 4 is a top view of a pixel array 40 according to an embodiment of the invention. It should be noted that, the embodiment of FIG. 4 adopts the reference numbers and part of the content in the embodiment of FIG. 1, where identical or similar reference numbers are used to indicate identical or similar components, and repeated description for the same technical contents is omitted. The omitted part of the description can refer to the foregoing embodiment, which is not repeated in the following embodiments.

The difference between the pixel array 40 of FIG. 4 and the pixel array 10 of FIG. 1 is that, the pixel array 40 further includes a third data line DL3, a third signal line CL3 and a third pixel unit PU3.

The third data line DL3 is disposed intersecting the first scan line SL1. The first data line DL1 is located between the second data line DL2 and the third data line DL3. The third signal line CL3 is located on the third data line DL3.

The third pixel unit PU3 includes a fifth switch element TFT5, a sixth switch element TFT6, a fifth common electrode CE5, a sixth common electrode CE6, a fifth pixel electrode PE5 and a sixth pixel electrode PE6.

The fifth common electrode CE5 and the sixth common electrode CE6 are respectively located on a first side W1 and a second side W2 of the first scan line SL1. The sixth common electrode CE6 is electrically connected to the third signal line CL3 through a third conductive structure CS3. The fifth pixel electrode PE5 and the sixth pixel electrode PE6 are respectively overlapping a part of the fifth common electrode CE5 and a part of the sixth common electrode CE6.

The fifth switch element TFT5 includes a fifth drain electrode D5, a fifth source electrode S5, a fifth gate electrode G5 and a fifth semiconductor layer SM5. The fifth gate electrode G5 of the fifth switch element TFT5 is electrically connected to the first scan line SL1, the fifth source electrode S5 is electrically connected to the third data line DL3, and the fifth pixel electrode PE5 is electrically connected to the fifth drain electrode D5 through a fifth contact TH5. At least part of the fifth semiconductor layer SM5 is located between the fifth gate electrode G5, the fifth source electrode S5 and the fifth drain electrode D5.

The sixth switch element TFT6 includes a sixth drain electrode D6, a sixth source electrode S6, a sixth gate electrode G6 and a sixth semiconductor layer SM6. The sixth gate electrode G6 of the sixth switch element TFT6 is electrically connected to the first scan line SL1. In an embodiment, the sixth source electrode S6 of the sixth switch element TFT6 may be electrically connected to the fifth source electrode S5; more specifically, the sixth source electrode S6 of the sixth switch element TFT6 is electrically connected to the third data line DL3 through the fifth switch element TFT5. The sixth pixel electrode PE6 is electrically connected to the sixth drain electrode D6 through a sixth contact TH6. At least part of the sixth semiconductor layer SM6 is located between the sixth gate electrode G6, the sixth source electrode S6 and the sixth drain electrode D6.

In the present embodiment, the fifth drain electrode D5 of the fifth switch element TFT5 and the sixth drain electrode D6 of the sixth switch element TFT6 both extend towards the fifth pixel electrode PE5.

In an embodiment, the first common electrode CE1 is electrically connected to the third common electrode CE3 and the fifth common electrode CE5. The second common electrode CE2 is electrically connected to the fourth common electrode CE4 and the sixth common electrode CE6. In an embodiment, the third common electrode CE3, the first common electrode CE1 and the fifth common electrode CE5 are structurally connected in sequence, and the fourth common electrode CE4, the second common electrode CE2 and the sixth common electrode CE6 are structurally connected in sequence.

In an embodiment, the third pixel unit PU3 further includes a third sharing element ST3. The third sharing element ST3 includes a gate electrode SG3, a semiconductor layer SSM3, a source electrode SS3 and a drain electrode SD3. The gate electrode SG3 of the third sharing element ST3 is electrically connected to the first scan line SL1. At least part of the semiconductor layer SSM3 is located between the gate electrode SG3, the source electrode SS3 and the drain electrode SD3. The source electrode SS3 of the third sharing element ST3 is electrically connected to the sixth pixel electrode PE6 through the sixth contact TH6, and the third conductive structure CS3 electrically connects the third signal line CL3, the drain electrode SD3 of the third sharing element ST3 and the sixth common electrode CE6.

Based on the above, in the pixel array 40 of the present embodiment, the first pixel unit PU1 has the first conductive structure CS1, the second pixel unit PU2 has the second conductive structure CS2, and the third pixel unit PU3 has the third conductive structure CS3. The second common electrode CE2 of the first pixel unit PU1 can be electrically connected to the third common electrode CE3 of the second pixel unit PU2 simply through the first conductive structure CS1, the second conductive structure CS2 and the first signal line CL1. Because the common electrodes on the different sides of the scan line can be electrically connected by utilizing the conductive structures in the different pixel units and commonly constitute a mesh structure, the number of the conductive structures required for conducting through the common electrodes can be reduced. In an embodiment, the first sharing element ST1 is electrically connected to the second common electrode CE2 and the first signal line CL1 through the first conductive structure CS1, the second sharing element ST2 is electrically connected to the third common electrode CE3 and the first signal line CL1 through the second conductive structure CS2, and the third sharing element ST3 is electrically connected to the sixth common electrode CE6 and the third signal line CL3 through the third conductive structure CS3. In this way, the problem regarding insufficient aperture ratio of the pixel array 40 can be solved.

Figure 5:
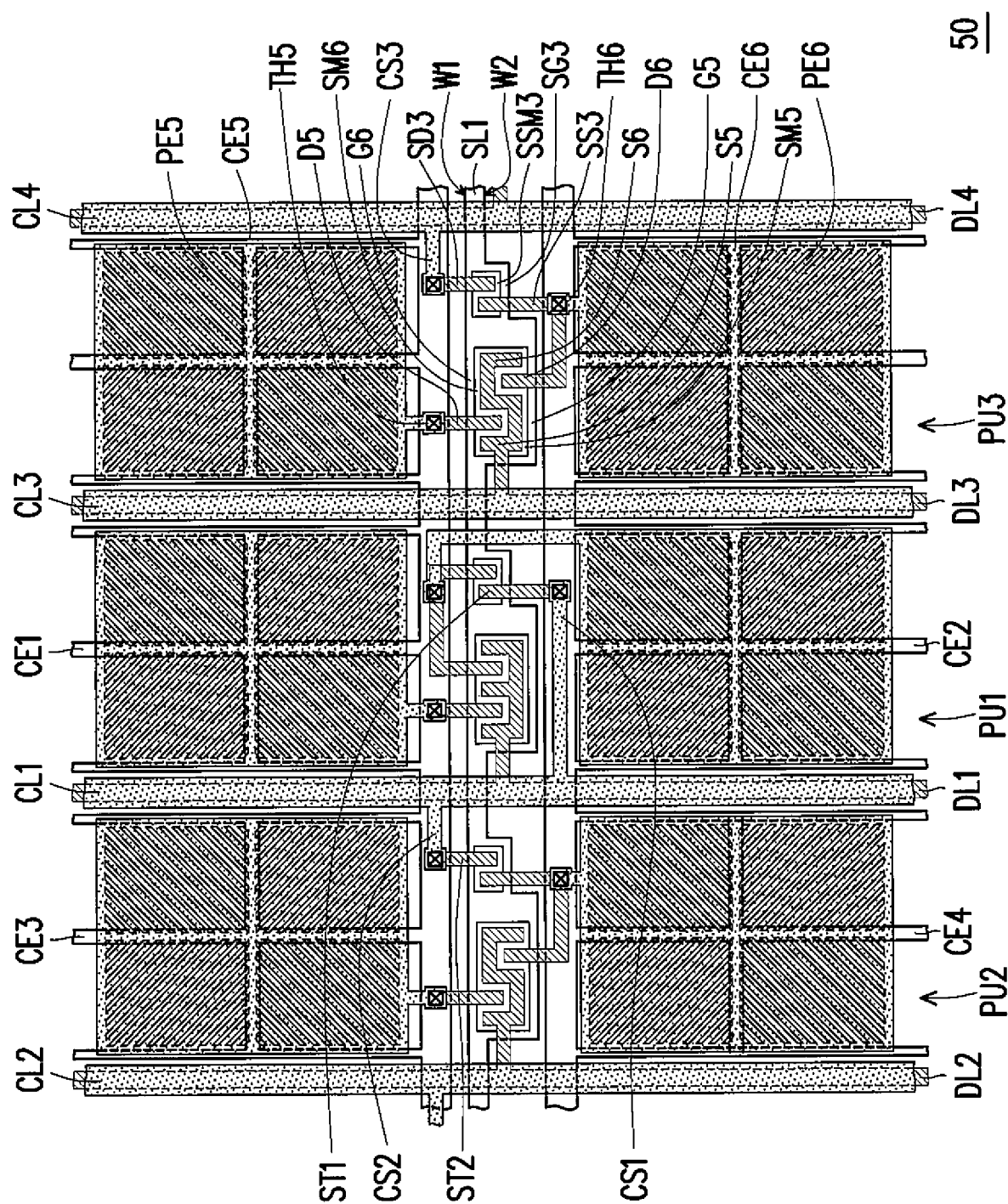
FIG. 5 is a top view of a pixel array according to an embodiment of the invention.

FIG. 5 is a top view of a pixel array 50 according to an embodiment of the invention. It should be noted that, the embodiment of FIG. 5 adopts the reference numbers and part of the content in the embodiment of FIG. 1, where identical or similar reference numbers are used to indicate identical or similar components, and repeated description for the same technical contents is omitted. The omitted part of the description can refer to the foregoing embodiment, which is not repeated in the following embodiments.

The difference between the pixel array 50 of FIG. 5 and the pixel array 10 of FIG. 1 is that, the pixel array 50 further includes a third data line DL3, a fourth data line DL4, a third signal line CL3, a fourth signal line CL4 and a third pixel unit PU3.

The third data line DL3 and the fourth data line DL4 are disposed intersecting the first scan line SL1. The first data line DL1 is located between the second data line DL2 and the third data line DL3, and the third data line DL3 is located between the first data line DL1 and the fourth data line DL4. The third signal line CL3 is located on the third data line DL3. The fourth signal line CL4 is located on the fourth data line DL4.

The third pixel unit PU3 includes a fifth switch element TFT5, a sixth switch element TFT6, a fifth common electrode CE5, a sixth common electrode CE6, a fifth pixel electrode PE5 and a sixth pixel electrode PE6.

The fifth common electrode CE5 and the sixth common electrode CE6 are respectively located on a first side W1 and a second side W2 of the first scan line SL1. The fifth common electrode CE5 is electrically connected to the fourth signal line CL4 through a third conductive structure CS3. The fifth pixel electrode PE5 and the sixth pixel electrode PE6 are respectively overlapping a part of the fifth common electrode CE5 and a part of the sixth common electrode CE6.

The fifth switch element TFT5 includes a fifth drain electrode D5, a fifth source electrode S5, a fifth gate electrode G5 and a fifth semiconductor layer SM5. The fifth gate electrode G5 of the fifth switch element TFT5 is electrically connected to the first scan line SL1, the fifth source electrode S5 is electrically connected to the third data line DL3, and the fifth pixel electrode PE5 is electrically connected to the fifth drain electrode D5 through a fifth contact TH5. At least part of the fifth semiconductor layer SM5 is located between the fifth gate electrode G5, the fifth source electrode S5 and the fifth drain electrode D5.

The sixth switch element TFT6 includes a sixth drain electrode D6, a sixth source electrode S6, a sixth gate electrode G6 and a sixth semiconductor layer SM6. The sixth gate electrode G6 of the sixth switch element TFT6 is electrically connected to the first scan line SL1. In an embodiment, the sixth source electrode S6 of the sixth switch element TFT6 may be electrically connected to the fifth source electrode S5; more specifically, the sixth source electrode S6 of the sixth switch element TFT6 is electrically connected to the third data line DL3 through the fifth switch element TFT5. The sixth pixel electrode PE6 is electrically connected to the sixth drain electrode D6 through a sixth contact TH6. At least part of the sixth semiconductor layer SM6 is located between the sixth gate electrode G6, the sixth source electrode S6 and the sixth drain electrode D6.

In the present embodiment, the fifth drain electrode D5 of the fifth switch element TFT5 extends towards the fifth pixel electrode PE5, and the sixth drain electrode D6 of the sixth switch element TFT6 extends towards the sixth pixel electrode PE6.

In an embodiment, the first common electrode CE1 is electrically connected to the third common electrode CE3 and the fifth common electrode CE5. The second common electrode CE2 is electrically connected to the fourth common electrode CE4 and the sixth common electrode CE6. In an embodiment, the third common electrode CE3, the first common electrode CE1 and the fifth common electrode CE5 are structurally connected in sequence, and the fourth common electrode CE4, the second common electrode CE2 and the sixth common electrode CE6 are structurally connected in sequence.

In an embodiment, the third pixel unit PU3 further includes a third sharing element ST3. The third sharing element ST3 includes a gate electrode SG3, a semiconductor layer SSM3, a source electrode SS3 and a drain electrode SD3. The gate electrode SG3 of the third sharing element ST3 is electrically connected to the first scan line SL1. At least part of the semiconductor layer SSM3 is located between the gate electrode SG3, the source electrode SS3 and the drain electrode SD3. The source electrode SS3 of the third sharing element ST3 is electrically connected to the sixth pixel electrode PE6 through the sixth contact TH6, and the third conductive structure CS3 electrically connects the fourth signal line CL4, the drain electrode SD3 of the third sharing element ST3 and the fifth common electrode CE5.

Based on the above, in the pixel array 50 of the present embodiment, the first pixel unit PU1 has the first conductive structure CS1, the second pixel unit PU2 has the second conductive structure CS2, and the third pixel unit PU3 has the third conductive structure CS3. The second common electrode CE2 of the first pixel unit PU1 can be electrically connected to the third common electrode CE3 of the second pixel unit PU2 simply through the first conductive structure CS1, the second conductive structure CS2 and the first signal line CL1. Because the common electrodes on the different sides of the scan line can be electrically connected by utilizing the conductive structures in the different pixel units and commonly constitute a mesh structure, the number of the conductive structures required for conducting through the common electrodes can be reduced. In an embodiment, the first sharing element ST1 is electrically connected to the second common electrode CE2 and the first signal line CL1 through the first conductive structure CS1, the second sharing element ST2 is electrically connected to the third common electrode CE3 and the first signal line CL1 through the second conductive structure CS2, and the third sharing element ST3 is electrically connected to the fifth common electrode CE5 and the fourth signal line CL4 through the third conductive structure CS3. In this way, the problem regarding insufficient aperture ratio of the pixel array 50 can be solved.

To sum up, in the pixel array of the invention, the first pixel unit has the first conductive structure, and the second pixel unit has the second conductive structure. The second common electrode of the first pixel unit can be electrically connected to the third common electrode of the second pixel unit simply through the first conductive structure, the second conductive structure and the first signal line. Because the common electrodes on the different sides of the scan line can be electrically connected by utilizing the conductive structures in the different pixel units and commonly constitute a mesh structure, the number of the conductive structures required for conducting through the common electrodes can be reduced. In an embodiment, the first sharing element is electrically connected to the second common electrode and the first signal line through the first conductive structure, and the second sharing element is electrically connected to the third common electrode and the first signal line through the second conductive structure. In this way, the problem regarding the insufficient aperture ratio of the pixel array can be solved. In an embodiment, with structurally different conductive structures being alternately arranged in the column direction and the row direction to prevent similar conductive structures from gathering together, the impedance difference caused by the structurally different conductive structures can be evenly distributed.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A pixel array, comprising:
    a first scan line;
    a first data line, disposed intersecting the first scan line;
    a first signal line, located on the first data line;
    a first pixel unit and a second pixel unit, the first data line being located between the first pixel unit and the second pixel unit, wherein
    the first pixel unit comprises:
        a first common electrode and a second common electrode, respectively located on a first side and a second side of the first scan line, wherein the second common electrode is electrically connected to the first signal line through a first conductive structure; and
        a first pixel electrode and a second pixel electrode, respectively overlapping a part of the first common electrode and a part of the second common electrode;
    the second pixel unit comprises:
        a third common electrode and a fourth common electrode, respectively located on the first side and the second side of the first scan line, wherein the first common electrode is electrically connected to the third common electrode, the second common electrode is electrically connected to the fourth common electrode, and the third common electrode is electrically connected to the first signal line through a second conductive structure; and
        a third pixel electrode and a fourth pixel electrode, respectively overlapping a part of the third common electrode and a part of the fourth common electrode.

2. The pixel array as recited in claim 1, further comprising:
    a second data line, disposed intersecting the first scan line, the second pixel unit being located between the second data line and the first data line, wherein
    the first pixel unit comprises:
        a first switch element, electrically connected to the first scan line and the first data line, the first pixel electrode being electrically connected to the first switch element through a first contact; and
        a second switch element, electrically connected to the first scan line, the second pixel electrode being electrically connected to the second switch element through a second contact;
    the second pixel unit comprises:
        a third switch element, electrically connected to the first scan line and the second data line, the third pixel electrode being electrically connected to the third switch element through a third contact; and
        a fourth switch element, electrically connected to the first scan line, the fourth pixel electrode being electrically connected to the fourth switch element through a fourth contact.

3. The pixel array as recited in claim 2, wherein
    the first pixel unit further comprises a first sharing element, electrically connected to the second pixel electrode and the first signal line, and
    the second pixel unit further comprises a second sharing element, electrically connected to the fourth pixel electrode and the first signal line.

4. The pixel array as recited in claim 3, wherein a source electrode of the first sharing element is electrically connected to the second switch element, and the first conductive structure electrically connects a drain electrode of the first sharing element, the first signal line and the second common electrode.

5. The pixel array as recited in claim 4, wherein a source electrode of the second sharing element is electrically connected to the fourth sharing element, and the second conductive structure electrically connects a drain electrode of the second sharing element, the first signal line and the third common electrode.

6. The pixel array as recited in claim 2, wherein the first switch element comprises a first drain electrode, the second switch element comprises a second drain electrode, and the first drain electrode and the second drain electrode both extend towards the first pixel electrode.

7. The pixel array as recited in claim 6, wherein the third switch element comprises a third drain electrode, the fourth switch element comprises a fourth drain electrode, the third drain electrode extends towards the third pixel electrode, and the fourth drain electrode extends towards the fourth pixel electrode.

8. The pixel array as recited in claim 7, wherein the first switch element comprises a first source electrode, the second switch element comprises a second source electrode, the third switch element comprises a third source electrode, the fourth switch element comprises a fourth source electrode, the first source electrode is electrically connected to the second source electrode, and the third source electrode is electrically connected to the fourth source electrode.

9. The pixel array as recited in claim 2, further comprising:
  a second scan line, disposed intersecting the first data line and the second data line;
  a third pixel unit, comprising:
    a fifth switch element and a sixth switch element, electrically connected to the second scan line;
    a fifth common electrode and a sixth common electrode, respectively located on a first side and a second side of the second scan line;
    a fifth pixel electrode and a sixth pixel electrode, respectively overlapping a part of the fifth common electrode and a part of the sixth common electrode, the fifth pixel electrode being electrically connected to the fifth switch element through a fifth contact, the sixth pixel electrode being electrically connected to the sixth switch element through a sixth contact;
    a first sharing element, wherein a source electrode of the first sharing element is electrically connected to the sixth pixel electrode, and a drain electrode of the first sharing element is electrically connected to the sixth common electrode; and
    a third conductive structure, electrically connecting the first signal line and the drain electrode of the first sharing element; and
  a fourth pixel unit, comprising:
    a seventh switch element and an eighth switch element, electrically connected to the second scan line;
    a seventh common electrode and an eighth common electrode, respectively located on the first side and the second side of the second scan line, the fifth common electrode being electrically connected to the seventh common electrode, the sixth common electrode being electrically connected to the eighth common electrode;
    a seventh pixel electrode and an eighth pixel electrode, respectively overlapping a part of the seventh common electrode and a part of the eighth common electrode, the seventh pixel electrode being electrically connected to the seventh switch element through a seventh contact, the eighth pixel electrode being electrically connected to the eighth switch element through an eighth contact;
    a second sharing element, wherein a source electrode of the second sharing element is electrically connected to the eighth pixel electrode, and a drain electrode of the second sharing element is electrically connected to the seventh common electrode; and
    a fourth conductive structure, electrically connecting the first signal line and the drain electrode of the second sharing element.

10. The pixel array as recited in claim 9, wherein the fifth common electrode is electrically connected to the second common electrode, and the seventh common electrode is electrically connected to the fourth common electrode.

11. The pixel array as recited in claim 2, further comprising:
  a second scan line, disposed intersecting the first data line and the second data line;
  a third data line, disposed intersecting the first scan line and the second scan line, wherein the first data line is located between the second data line and the third data line;
  a second signal line, located on the second data line;
  a third signal line, located on the third data line;
  a third pixel unit, comprising:
    a fifth common electrode and a sixth common electrode, respectively located on a first side and a second side of the second scan line;
    a fifth pixel electrode and a sixth pixel electrode, respectively overlapping a part of the fifth common electrode and a part of the sixth common electrode, the fifth common electrode being electrically connected to the third signal line through a third conductive structure; and
  a fourth pixel unit, located between the first data line and the second data line, and comprising:
    a seventh common electrode and an eighth common electrode, respectively located on the first side and the second side of the second scan line, the fifth common electrode being electrically connected to the seventh common electrode, the sixth common electrode being electrically connected to the eighth common electrode;
    a seventh pixel electrode and an eighth pixel electrode, respectively overlapping a part of the seventh common electrode and a part of the eighth common electrode, the eighth common electrode being electrically connected to the second signal line through a fourth conductive structure.

12. The pixel array as recited in claim 11, wherein the third pixel unit further comprises:
  a fifth switch element and a sixth switch element, electrically connected to the second scan line, wherein the fifth pixel electrode is electrically connected to the fifth switch element through a fifth contact, and the sixth pixel electrode is electrically connected to the sixth switch element through a sixth contact;
  a first sharing element, wherein a source electrode of the first sharing element is electrically connected to the sixth pixel electrode, and the third conductive structure electrically connects a drain electrode of the first sharing element, the third signal line and the fifth common electrode; and
the fourth pixel unit further comprises:
  a seventh switch element and an eighth switch element, electrically connected to the second scan line, wherein the seventh pixel electrode is electrically connected to the seventh switch element through a seventh contact, and the eighth pixel electrode is electrically connected to the eighth switch element through an eighth contact;
  a second sharing element, wherein a source electrode of the second sharing element is electrically connected to the eighth pixel electrode, and the fourth conductive structure electrically connects a drain electrode of the second sharing element, the second signal line and the eighth common electrode.

13. The pixel array as recited in claim 12, wherein the first switch element comprises a first drain electrode, the second switch element comprises a second drain electrode, and the first drain electrode and the second drain electrode both extend towards the first pixel electrode;
the third switch element comprises a third drain electrode, the fourth switch element comprises a fourth drain electrode, the third drain electrode extends towards the third pixel electrode, and the fourth drain electrode extends towards the fourth pixel electrode;
the fifth switch element comprises a fifth drain electrode, the sixth switch element comprises a sixth drain electrode, the fifth drain electrode extends towards the fifth pixel electrode, and the sixth drain electrode extends towards the sixth pixel electrode;
the seventh switch element comprises a seventh drain electrode, the eighth switch element comprises an eighth drain electrode, and the seventh drain electrode and the eighth drain electrode both extend towards the seventh pixel electrode.

14. The pixel array as recited in claim 2, further comprising:
a third data line, disposed intersecting the first scan line, wherein the first data line is located between the second data line and the third data line;
a third signal line, located on the third data line;
a third pixel unit, comprising:
a fifth switch element and a sixth switch element, electrically connected to the first scan line and the third data line;
a fifth common electrode and a sixth common electrode, respectively located on the first side and the second side of the first scan line, wherein the sixth common electrode is electrically connected to the third signal line through a third conductive structure;
a fifth pixel electrode and a sixth pixel electrode, respectively overlapping a part of the fifth common electrode and a part of the sixth common electrode, the fifth pixel electrode being electrically connected to the fifth switch element through a fifth contact, the sixth pixel electrode being electrically connected to the sixth switch element through a sixth contact.

15. The pixel array as recited in claim 14, wherein the first switch element comprises a first drain electrode, the second switch element comprises a second drain electrode, and the first drain electrode and the second drain electrode both extend towards the first pixel electrode;
the third switch element comprises a third drain electrode, the fourth switch element comprises a fourth drain electrode, the third drain electrode extends towards the third pixel electrode, and the fourth drain electrode extends towards the fourth pixel electrode;
the fifth switch element comprises a fifth drain electrode, the sixth switch element comprises a sixth drain electrode, and the fifth drain electrode and the sixth drain electrode both extend towards the fifth pixel electrode;
the first common electrode is electrically connected to the third common electrode and the fifth common electrode, and the second common electrode is electrically connected to the fourth common electrode and the sixth common electrode.

16. The pixel array as recited in claim 2, further comprising:
a third data line and a fourth data line, disposed intersecting the first scan line, wherein the first data line is located between the second data line and the third data line, and the third data line is located between the first data line and the fourth data line;
a third signal line, located on the third data line;
a fourth signal line, located on the fourth data line;
a third pixel unit, comprising:
a fifth switch element and a sixth switch element, electrically connected to the first scan line and the third data line;
a fifth common electrode and a sixth common electrode, respectively located on the first side and the second side of the first scan line, wherein the fifth common electrode is electrically connected to the fourth signal line through a third conductive structure;
a fifth pixel electrode and a sixth pixel electrode, respectively overlapping a part of the fifth common electrode and a part of the sixth common electrode, the fifth pixel electrode being electrically connected to the fifth switch element through a fifth contact, the sixth pixel electrode being electrically connected to the sixth switch element through a sixth contact.

17. The pixel array as recited in claim 16, wherein the first switch element comprises a first drain electrode, the second switch element comprises a second drain electrode, and the first drain electrode and the second drain electrode both extend towards the first pixel electrode;
the third switch element comprises a third drain electrode, the fourth switch element comprises a fourth drain electrode, the third drain electrode extends towards the third pixel electrode, and the fourth drain electrode extends towards the fourth pixel electrode;
the fifth switch element comprises a fifth drain electrode, the sixth switch element comprises a sixth drain electrode, the fifth drain electrode extends towards the fifth pixel electrode, and the sixth drain electrode extends towards the sixth pixel electrode;
the first common electrode is electrically connected to the third common electrode and the fifth common electrode, and the second common electrode is electrically connected to the fourth common electrode and the sixth common electrode.

18. The pixel array as recited in claim 1, wherein the first common electrode, the second common electrode, the third common electrode, the fourth common electrode and the first scan line belong to a same film layer, and the first pixel electrode, the second pixel electrode, the third pixel electrode, the fourth pixel electrode and the first signal line belong to a same film layer.

* * * * *